(12) United States Patent
Choquette et al.

(10) Patent No.: US 7,085,301 B2
(45) Date of Patent: Aug. 1, 2006

(54) PHOTONIC CRYSTAL SINGLE TRANSVERSE MODE DEFECT STRUCTURE FOR VERTICAL CAVITY SURFACE EMITTING LASER

(75) Inventors: Kent D. Choquette, Urbana, IL (US); Noriyuki Yokouchi, Yokohama (JP)

(73) Assignees: The Board of Trustees of the University of Illinois, Urbana, IL (US); The Furukawa Electric Co., Ltd., Chiyoda-ku (JP)

( * ) Notice: Subject to any disclaimer, the term of this patent is extended or adjusted under 35 U.S.C. 154(b) by 292 days.

(21) Appl. No.: 10/618,034

(22) Filed: Jul. 11, 2003

(65) Prior Publication Data

US 2004/0091010 A1  May 13, 2004

Related U.S. Application Data

(60) Provisional application No. 60/472,075, filed on May 20, 2003, provisional application No. 60/395,487, filed on Jul. 12, 2002.

(51) Int. Cl.
*H01S 5/00*     (2006.01)
*H01S 3/08*     (2006.01)
*H01S 3/098*    (2006.01)
(52) U.S. Cl. .................. 372/50.124; 372/19; 372/92
(58) Field of Classification Search ............... 372/9, 372/19, 43, 54, 92, 50.124
See application file for complete search history.

(56) References Cited

U.S. PATENT DOCUMENTS 6,515,305 B1 *  2/2003  Gopinath ..................... 257/79
6,683,898 B1 *  1/2004  Østergaard et al. ........... 372/43

FOREIGN PATENT DOCUMENTS

JP    10-284806    10/1998
JP    11-186657    7/1999

OTHER PUBLICATIONS

Song et al, Single-fundamental-mode photonic-crystal vertical-cavity surface-emitting lasers, Applies Physics Letters, May 27, 2002, vol. 80, No. 21.*
Choquette et al., "Room temperature continuous wave InGaAsN quantum well vertical-cavity lasers emitting at 1.3 μm", Electronics Letters, vol. 36, No. 16, Aug. 3, 2000.
Song et al., "Single-fundamental-mode photonic-crystal vertical-cavity surface-emitting lasers", Applied Physics Letters, vol. 80, No. 21, May 27, 2002, pp. 3901-3903.

(Continued)

*Primary Examiner*—Armando Rodriguez
(74) *Attorney, Agent, or Firm*—Greer, Burns & Crain, Ltd

(57) ABSTRACT

The invention is directed to a photonic crystal defect structure for a vertical cavity surface emitting laser (VCSEL). In accordance with the invention, a set of holes is formed in a pattern with one or more missing holes forming a defect in the pattern of the photonic crystal, according to a proscribed depth, hole diameter, and pattern pitch which will insure operation in a single transverse mode.

15 Claims, 2 Drawing Sheets

OTHER PUBLICATIONS

Song et al., "Single-mode Photonic-crystal Vertical Cavity Surface Emitting Laser", Abstract No. CTuW1, CLEO, 2002, pp. 293-294.

Ueda et al., "Transverse Mode Control and Reduction of Thermal Resistance in 850 nm Oxide Confined VCSELs", IEICE Trans. Electron., vol. E85, No. 1, Jan. 2002, pp. 64-70.

Unold et al., "Large-Area Single-Mode VCSELs and the Self-Aligned Surface Relief", IEEE Journal on Selected Topics in Quantum Electronics, vol. 7, No. 2, Mar./Apr. 2001, pp. 386-392.

Unold et al., "Photonic Crystal Surface-Emitting Lasers: Tailoring Waveguiding for Single-Mode Emission", Proc. 27th Eur. Conf. on Opt. Comm., 2001, pp. 520-521.

Warren et al., "On-axis far-field emission from two-dimensional phase-locked vertical cavity surface-emitting laser arrays with an integrated phase-corrector", Applied Physics Letters, vol. 61, 1992, pp. 1484-1486.

Yokouchi et al., "Etching depth dependence of the effective refractive index in two-dimensional photonic-crystal-patterned vertical-cavity surface-emitting laser structures", Applied Physics Letters, vol. 82, No. 9, Mar. 3, 2003, pp. 1344-1346.

Yokouchi et al., "Vertical-cavity surface-emitting laser operating with photonic crystal seven-point defect structure", Applied Physics Letters, vol. 82, No. 21, May 26, 2003, pp. 3608-3610.

Young et al., "Comparison of Wavelength Splitting for Selectively Oxidized, Ion Implanted, and Hybrid Vertical-Cavity Surface-Emitting Lasers", IEEE Journal of Quantum Electronics, vol. 39, No. 5, May 2003, pp. 634-639.

* cited by examiner

PHOTONIC CRYSTAL SINGLE TRANSVERSE MODE DEFECT STRUCTURE FOR VERTICAL CAVITY SURFACE EMITTING LASER

REFERENCE TO RELATED APPLICATION AND PRIORITY CLAIM

This application is related to co-pending provisional application serial No. 60/395,487, filed on Jul. 12, 2002, and claims priority from that provisional application under 35 U.S.C. §119. This application is also related to co-pending provisional application No. 60/472,075, filed on May 20, 2003, and claims priority from that provisional application under 35 U.S.C. §119.

STATEMENT OF GOVERNMENT INTEREST

This invention was made with Government assistance under NSF grant number ECS0122906. The Government has certain rights in this invention.

FIELD OF THE INVENTION

The field of the invention is the field of vertical cavity surface emitting lasers (VCSELs).

BACKGROUND OF THE INVENTION

Semiconductor lasers are the basis for optoelectronics, and also many other devices that make use of laser emissions. Laterally emitting lasers are in widespread commercial use. These type of lasers emit from the cleaved facet in the lateral direction. While high powers may be obtained, the lateral emission is inconvenient for integrating the device with other similar or different devices. Laterally emitting lasers also have elliptical beams that diverge at a greater rate along the major axis of the elliptical cross-section of the beam. The uneven divergence and shape of the elliptical beams sometimes limits the effectiveness of the laterally emitting laser devices.

Another type of semiconductor laser is the vertical cavity surface emitting laser (VCSEL). The VCSEL emits in the vertical direction. That provides advantages for the integration of the VCSEL with other like or different devices. Though VCSELs typically emit lower power than the laterally emitting lasers, the VCSELs provide a beam having a circular cross-section. The VCSELs are also very compact. A typical VCSEL is a few to ten microns in length and about 1 to 10 microns in diameter. In addition, the circularly shaped beam of a VCSEL diverges at an equal rate in all directions. Although the VCSEL usually inherently exhibits a single longitundinal mode, it is important to achieve single transverse mode operation.

To achieve single transverse mode operation in a VCSEL, several approaches have been pursued. For a conventional ion implanted structure, which has no lateral index confinement, single mode operation is achieved by controlling the size of the transverse cavity diameter. This intrinsically limits the single mode output power. Oxide confined VCSEL structures with sufficiently small aperture diameter have also demonstrated single mode operation. A small oxide aperture realizes single mode operation where higher order modes are in cut-off. However, the refractive index contrast between oxidized and unoxidized regions is so high that the diameter of the aperture should be smaller than 3 to 4 microns at an 850 nm emission wavelength. This geometry is difficult to manufacture and it results in unavoidably high electrical resistance and limited output power of less than around 1 mW. More complicated approaches for achieving single mode emission in VCSELs include surface relief etching, see, e.g. H. J. Unold et al., IEEE Journal of Selected Topics in Quantum Electronics, vol. 7, No. 2, p386, 2002; mode selective reflectivity, see, e.g., N. Ueda et al., IEICE Trans. Electron., vol. E85-C, No. 1, p64, 2002; and, an extended cavity structure which applies an additional diffraction loss on higher order modes, see, e.g., D. G. Deppe et al., Electronics Letters, vol. 33, No. 3, p211, 1997. In addition, an ion implant and oxide aperture can be combined within a single device to achieve single transverse mode operation, see E. W. Young, et al, Photon. Tech. Lett. Vol 13, p927, 2001. These approaches each deteriorate the lasing performance of the fundamental mode along with the undesirable higher order modes because the fundamental mode and the other higher order modes have a degree of spatial overlap. Introducing scattering losses in the higher order modes introduces loss to the fundamental mode.

There are Japanese patent publications directed to photonic crystal confined VCSELs, see, Japanese Patent publications H10-284806A and Japanese Patent H11-186657A. These publications show a photonic structure including a pattern of holes, and suppose the existence of a photonic bandgap at operating wavelength. Similarly to these publications, the existence of a single mode is claimed regarding a photonic structure including a pattern of holes and a defect in Song et al., Appl. Phys. Lett Vol. 80, number 21, May 27, 2002. However, the publications provide no guidance on setting device physical parameters to permit the design of VCSELs exhibiting single transverse mode operation.

To achieve coherent coupling between VCSELs in a 2D array, several strategies have been previously demonstrated. A leaky mode approach based on changes of the cavity length has been shown to provide coupling between elements, although complex fabrication processing including a re-growth step is required, see, e.g. D. Serkland, K. D. Choquette, et al., Appl. Phys. Lett. 75, 3754 (1999). Deep etching the array pixels combined with a "checker-board" phase matching layers has demonstrated a coupled lowest order array mode, but this also involves complex fabrication procedures, see, e.g., M. Warren, et al., Appl. Phys. Lett. 61, 1484 (1992). The objective to all of these approaches is to establish the lowest order supermode, which has high power in the central far-field lobe; achieving this objective will enable the development of very high power (>100 mW) single mode VCSEL sources. There remains a need for improved VCSEL structures which enable single transverse mode operation and/or transverse coupling.

SUMMARY OF THE INVENTION

The invention is directed to a photonic crystal defect structure for a vertical cavity surface emitting laser (VCSEL). In accordance with the invention, a set of holes is formed in a pattern with one or more missing holes forming a defect in the pattern of the photonic crystal, according to a prescribed depth, hole diameter, and pattern pitch which will insure operation in a single transverse mode.

DETAILED DESCRIPTION OF THE PREFERRED EMDODIMENTS

Figure 1:
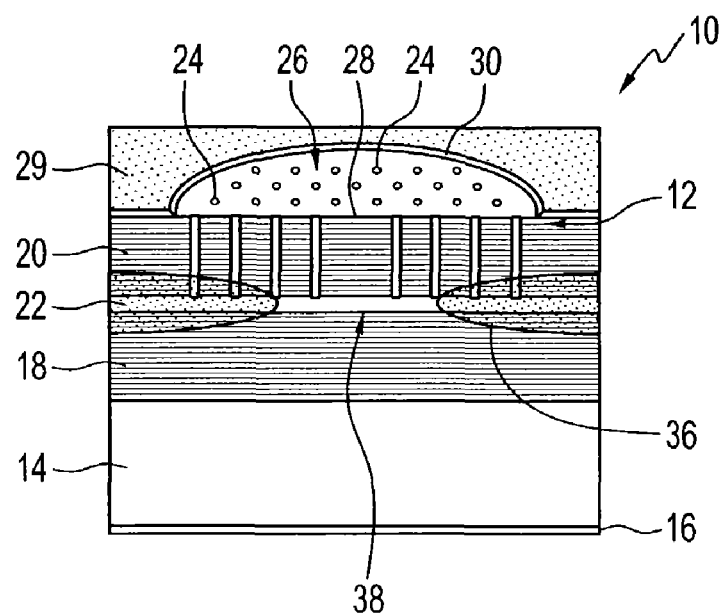
FIG. 1 shows a schematic perspective view of a cross section of a preferred embodiment vertical cavity surface emitting laser including a photonic crystal hole pattern in accordance with an embodiment of the invention.

This invention concerns a photonic crystal defect structure for a vertical cavity surface emitting laser (VCSEL). A VCSEL of the invention includes a photonic crystal with a pattern of holes included a missing hole(s) defect, with the holes, pattern pitch, and hole depth dimensioned accordingly to provide a single transverse mode. The pattern including a missing hole(s) defect is necessary for single mode operation, and our calculations and simulations indicated that, without the defect and without hole diameter, pattern pitch, and hole depth dimensioned accordingly to provide a single transverse mode, even an optimized structure will not exhibit a photonic bandgap at operating wavelength. In another aspect of the invention, the confinement produced by the hole pattern with defect permits optimizations. Optimizations are realized by engineering the transverse optical mode profile in one or more longitudinal cavities. In another aspect of the invention, coupling is engineered between two or more longitudinal cavities by setting the geometrical characteristics of the pattern of holes and the missing hole(s) defect.

Lasers of the invention have many applications. An exemplary application is for high-speed optical communication systems and/or data links. In such systems, a VCSEL with a single transverse mode optical emission property is a key component. Also, new applications will emerge for transversely coherently coupled VCSELs within a 2-dimensional (2D) array. Transversely coupled cavities also provide a key component for optical processing applications. The coupling of emission responses can be used as a form of logic.

The invention will now be illustrated by discussing some preferred embodiment laser devices and including preferred hole with defect patterns. In describing the invention, particular exemplary devices, formation processes, and device applications will be used for purposes of illustration. Dimensions and illustrated devices may be exaggerated for purposes of illustration and understanding of the invention. The elements of the drawings are not necessarily to scale relative to each other. Like reference numerals designate corresponding similar though not necessarily exact parts through the several views. Schematic views will be understood by artisans as such views are commonly used in the art. Devices of the invention may be formed using conventional equipment.

Referring now to FIG. 1, a vertical cavity surface emitting laser (VCSEL) 10 that includes a photonic crystal defect structure 12 is shown in a schematic perspective view of a vertical cross section. The device includes a substrate 14 having a bottom electrode 16 formed on its bottom surface and in electrical contact with the substrate 14. A bottom distributed Bragg reflector 18 is formed on an opposite side of the substrate 14 from the bottom electrode 16. A top distributed Bragg reflector 20 defines the upper part of a vertical cavity 22, which includes claddings that clad an active region. Lateral confinement in the VCSEL 10 is achieved with a plurality of holes 24 dimensioned according to a depth dependence single transverse mode factor. In preferred embodiments, the holes are finite depth holes dimensioned according to the single transverse mode factor, and in other embodiments the holes are infinite depth holes dimensioned according to the single transverse mode factor. A finite depth hole means the hole has a depth that is less than the length of the full reflective path of the beam in the VCSEL, while an infinite depth hole has a length that is equal to or greater than the full reflective path of the beam. The single transverse mode factor of the invention sets the ratio of the hole diameter divided by the pattern pitch according to depth. Finite depth holes require a diameter/pitch ratio that is easily achieved by current fabrication techniques. Infinite depth holes require a diameter/pitch ratio for which single mode operation has been mathematically confirmed. The aspect ratio of infinite depth holes formed according to the single transverse mode factor of the invention is readily defined, but may be difficult to manufacture. Improvements of current manufacturing processes and the development of new hole formation techniques will benefit the application of the invention for embodiments using infinite depth holes.

The holes 24 are arranged in a pattern 26 including one or more missing holes in the defect 28 in the pattern. A top electrode 29 includes an aperture 30, which may be larger or smaller than the pattern 26. Multiple patterns each with one or more hole defects may also be formed, and each defect 28 may include one or more missing holes. With power applied to the electrodes 16 and 29, the VCSEL 10 will emit a beam from an area where the defect 28 is present.

Figure 2:
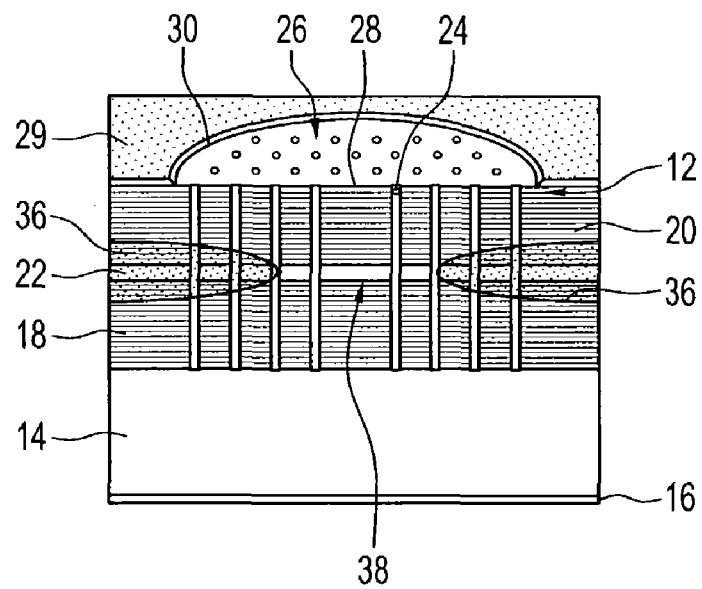
FIG. 2 shows a schematic perspective view of a cross section of a preferred embodiment vertical cavity surface emitting laser including a photonic crystal hole pattern in accordance with an embodiment of the invention.
Figure 3:
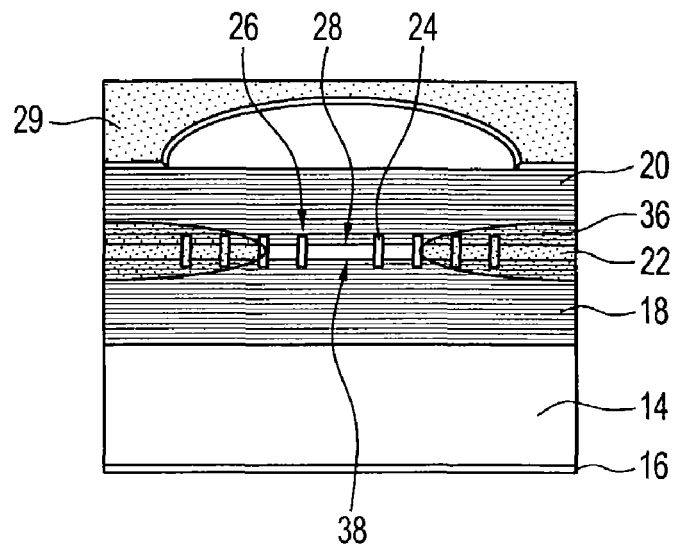
FIG. 3 shows schematic perspective view of a cross section of a preferred embodiment vertical cavity surface emitting laser including a photonic crystal hole pattern in accordance with an embodiment of the invention.

The holes 24 in the pattern 26 are empty spaces or contain material with a higher or lower refractive index compared to the material in which the holes are formed, and may be referred to as air holes. The holes may be formed by a simple etch. Their smallest diameter depends upon their pitch and depth, but their diameter may otherwise be tailored for specific engineered and optimized embodiments of the invention. Additional embodiments are shown in FIGS. 2 and 3. In the FIG. 2 embodiment, the pattern 26 extends through both the top and bottom distributed Bragg reflectors 20 and 18 and the vertical cavity 22.

All of these devices have a two dimensional photonic crystal formed by the periodically arranged pattern 26 of holes 24 with a defect 28. The holes 24 in FIG. 1 are arranged in a triangular grid. One or more of the holes 24 are removed to create at least one missing hole defect 28. This hexagonally shaped defect site 28 is the center of the confined VCSEL single transverse optical mode. A square pattern with a square shaped defect can also be designed to confine a single transverse mode. Similarly, an array of defects 28 in a larger pattern 26 will produce a 2D array of transversely confined VCSELs, where the coupling between the individual defects can be designed by varying dimensions of the holes 24 (diameter), pitch between holes, hole depth and defect radius.

An ion implanted or an oxidized region 36 may form an electrical current aperture 38 in a region of the vertical cavity 22. The electrical current aperture can be larger, equal to, or smaller than the photonic crystal defect diameter.

In the FIG. 1 embodiment, the active region (within the vertical cavity 22) is not exposed to the holes 26, and nonradiative carrier recombination, which is an undesirable carrier loss, will not occur. Also the hole depth, a typically being less than ~5 μm, is easier to be fabricate than the deep holes 24 as in the FIG. 2 embodiment. In the FIG. 1 embodiment, the top DBR with the patterned photonic crystal structure acts as a mode selective filter.

The FIG. 2 embodiment has deep holes 24 reaching substantially below the cavity 22. A complete single mode waveguide is realized by this embodiment. But this structure has some difficulty compared to the former device, i.e., deeper etching and nonradiative recombination at the exposed surface of the active region. The nonradiative recombination can be reduced by defining the current path to be smaller than the photonic crystal defect diameter.

The FIG. 3 embodiment has a photonic crystal structure only within the vertical cavity 22 and its vicinity in part of the top and bottom distributed Bragg reflectors 18 and 20. In this case, only the fundamental mode can be produced at the active region in the vertical cavity 22. Since both DBRs are almost perfect without any holes, the highest reflectivity can be expected among these structures. This structure may suffer from nonradiative recombination unless the current path is defined smaller than the photonic crystal defect diameter.

Exemplary material systems are summarized in Tables 1 and 2. Generally, any material system suitable for VCSEL devices is suitable for the invention.

TABLE 1

| Lasing Wavelength | 850 nm | 980 nm | 1300 nm/1550 nm |
|---|---|---|---|
| substrate | GaAs | GaAs | GaAs |
| DBR | AlGaAs/AlGaAs | AlGaAs/AlGaAs | AlGaAs/AlGaAs |
| Clad | AlGaAs | AlGaAs or GaAs or InGaP | AlGaAs or GaAs or GaNAs |
| Active | GaAs/AlGaAs QW | InGaAs/AlGaAs QW | GaInNAs/GaAs QW or GaInNAsSb/GaAs QW or GaInNAs/GaNAs QW or GaInNAsSb/GaNAs QW |

TABLE 2

| Lasing Wavelength | 1300 nm/1550 nm | 1300 nm/1550 nm |
|---|---|---|
| substrate | InP | GaAs |
| DBR | GaInAsP/GaInAsP | AlGaAs/AlGaAs |
| Clad | GaInAsP or InP or AlGaInAs | GaInAsP or InP or AlGaInAs |
| Active | GaInAsP/GaInAsP QW or GaInAsP/AlGaInAs QW | GaInAsP/GaInAsP QW or GaInAsP/AlGaInAs QW or |

Fabrication of VCSEL devices is similar to the formation process for conventional VCSEL devices, but includes an additional etch, or other material removal process, to form the holes 24. By way of example only, the FIG. 1 device may be formed by crystal growth, e.g., metalorganic chemical vapor deposition or molecular beam epitaxy to form the top and bottom Bragg reflectors 20 and 18 and the claddings and active region of the vertical cavity 22. Patterns in the Bragg reflectors are formed conventionally. The electrical current aperture 38 is formed, for example, by ion implantation with photoresist as a mask. A dielectric evaporation (for example a SiNx film by plasma-assisted chemical vapor deposition forms a thin layer for use as an etch mask. Electron beam lithography to define a pattern in the dielectric material creates a pattern mask. Holes are then formed (for example a hole diameter, b, relative to the lattice constant of the photonic crystal, a, is b/a=0.1) by a dry etching (e.g., inductively coupled plasma reactive ion etching). The dielectric mask is then removed (e.g., by reactive ion etching). Afterwards, a metalization (e.g., a conventional lift-off process on top surface of the top Bragg reflector 20) forms the top electrode 29.

The normalized frequency or V-parameter is used to determine the number of guided modes in cylindrical waveguides, e.g., optical fibers, and we have developed a modified version to be used to tailor the number of transverse modes in a VCSEL of the invention. The cutoff condition of the 1st higher mode leads to V=2.405, and thus a waveguide with V<2.405 is considered to be single mode. In a VCSEL of the invention, the effective V-parameter can be expressed by $$V_{eff} = \frac{2\pi r}{\lambda} \sqrt{n_{eff}^2 - (n_{eff} - \gamma \Delta n)^2} \quad (1)$$

where $\lambda$ is an operating wavelength, r is an equivalent defect radius, $n_{eff}$ is the effective refractive index of the VCSEL cavity without a photonic crystal hole pattern and defect structure present, $\Delta n$ is the refractive index reduction introduced by the photonic crystal hole pattern with infinite depth, and $\gamma$ is the depth dependence factor of the invention. The single transverse mode depth dependence factor $\gamma$ of the invention is defined by:

$$\gamma = \frac{\Delta n_{eff}}{\Delta n} = \frac{\frac{\Delta \lambda}{\lambda} n_{eff}}{\Delta n} \quad (2)$$

In equation (2), $\Delta\lambda$ is the reflectance wavelength shift that would arise when the effective refractive index of the mirror is replaced by photonic crystal refractive index for a material thickness equal to the depth of the holes, as calculated by standard approaches for distributed Bragg mirror reflectivities. The depth dependence single transverse mode factor $\gamma$ can be understood qualitatively as being proportional to the spatial overlap between the photonic crystal structure and the longitudinal optical power distribution inside the VCSEL structure. $\gamma=0$ for vanishing etching depth (holes approaching zero depth), $\gamma=1$ for infinite etching depth holes, and $\gamma=0.5$ for holes reaching the middle of the vertical cavity 22. The particular form of $\gamma$ as a function of etch depth will depend on the specific details of the VCSEL. A refractive index difference in the vertical cavity introduced by the holes should also be kept small enough to produce single mode operation.

For the purpose of further illustration of the invention, particular exemplary embodiments and experimental results will now be discussed. The results demonstrate preferred aspects of the invention, and will be appreciated by artisans to demonstrate the efficacy of the invention. Artisans will also appreciate that results do not limit broader aspects of the invention as discussed above.

In the following discussion, the equivalent defect radius of a single point defect and a 7-point defect structures are assumed to be $\Lambda$-d/2 and $\sqrt{3}\Lambda$-d/2, respectively, where $\Lambda$ is the pattern pitch and d is the hole diameter of a circular hole, respectively. Equation (1), which includes the $\gamma$ depth dependence factor is used to calculate normalized frequency. By this approach, the invention can be used to engineer particular embodiments of the invention, while providing for single mode transverse operation.

The refractive index variation $\Delta n$ can be obtained from the photonic band diagram of an out-of-plane propagation mode calculated by assuming that the photonic crystal structure is infinite both in lateral and vertical direction. For the following examples, a material index of 3.4 is assumed. The term $\Delta n$ strongly depends on both the pattern pitch and the relative hole diameter, d/$\Lambda$. As we are assuming $\lambda=850$ nm, a pattern pitch of 1 µm corresponds to 1.18.

A single transverse mode condition can be easily destroyed by a perturbation of refractive indices introduced by thermal effects or carrier injection. For a set of exemplary parameters of 5 µm photonic crystal lattice constant, d/$\Lambda=0.5$, and $\gamma<0.1$, $\Delta n$ is less than $10^{-3}$. By comparison, thermal effects in VCSELs can produce $\Delta n \sim 10^{-2}$, which will dominate the waveguide characteristics. To avoid this problem, $\Delta n$ should be increased as much as possible, and at the same time, $V_{eff}$ should remain <2.405 to retain the single mode condition. Large d/$\Lambda$ ratios seem to be effective for this purpose. But the large d/$\Lambda$ structure will also induce significant scattering loss.

Figure 4:
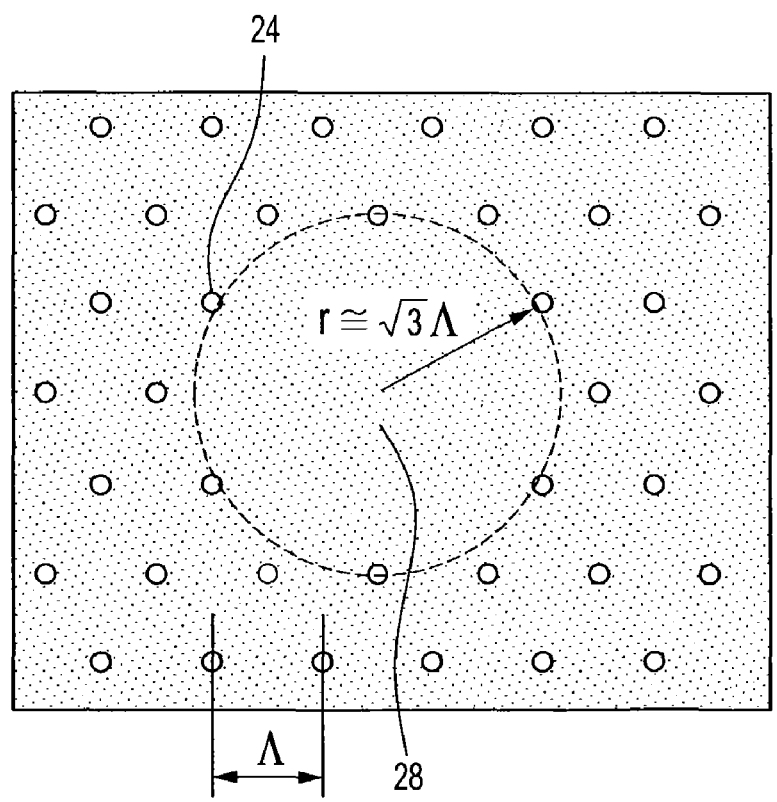
FIG. 4 shows a preferred embodiment hole pattern with a seven point defect.

Another method of increasing $\Delta n$ is by reducing the lattice constant, $\Lambda$, and choosing a 7-point defect structure. A seven point defect and hole pattern, including a missing hole defect 28 having seven missing holes contained within a a circumference defined by the radius of the defect pattern, is shown in FIG. 4. Since the equivalent defect radius increases from $\Lambda$-d/2 to $\sqrt{3}\Lambda$-d/2 by introducing the 7-point defect structure, $V_{eff}$ is enhanced by factor of 2.

Experimental devices in accordance with the invention have been formed. The experimental devices were VCSEL structures comprised of a GaAs substrate with 850 nm resonant-cavity wavelength with a vertical cavity sandwiched by a 25-periods of top DBR and a 35.5-periods of bottom DBR. Both DBRs were formed of $Al_{0.9}Ga_{0.1}As/Al_{0.2}Ga_{0.8}As$ pairs of layers. Experimental structures had a finite etching depth (in accordance with FIG. 1) and either incorporated a single point or a 7-point defect formed in the top DBR. Defect structures were delineated on the surface by using electron beam lithography and were fabricated by using an inductive coupled plasma reactive ion etching (ICP-RIE) technique with $SiCl_4$ as the etching gas. After metalization of top and bottom contacts, square shaped mesas were formed by conventional photolithography and additional ICP-RIE. Finally, the AlAs layer in the lower DBR was selectively oxidized to define a current aperture. $SiO_2$ film was used to protect the sidewalls of PhC holes during the oxidation process. We made 7-point defect devices with a lattice constant $\Lambda$ of 2.0 µm and different d/$\Lambda$ ratios of 0.3, 0.5 and 0.7. Since the etching depth of a small hole depends on its diameter, different hole diameters have different hole depths. Etching depths measured by using a scanning electron microscope were 1.68 µm, 1.85 µm and 1.92 µm for d/$\Lambda$ of 0.3, 0.5 and 0.7, respectively. This corresponds to 13, 14 and 15 periods etched into the top DBR, giving $\gamma$ values of 0.020, 0.024 and 0.032, respectively.

If the size of the oxide aperture is comparable to the defect size having the equivalent radius of about 3 µm, the photonic crystal confined mode will be affected by the large refractive index step of roughly 0.05 introduced by the oxide layer. Therefore, we used a large oxide aperture size of about 21 µm×21 µm, which was much larger than the defect diameter. An experimental device with the smallest d/$\Lambda$ of 0.3 had the lowest threshold current, but it operated in an oxide confined mode, which was confirmed by its spectrum and near field pattern. Devices with large d/$\Lambda$ (0.7) have high threshold currents and low efficiencies above threshold. Both devices operated in photonic crystal confined modes. Since the optical fields of these devices were confined in central defect areas, most of the injected current for each device passed through the surrounding photonic crystal confinement region and was wasted. This higher threshold current can be reduced by confining the injected current efficiently into the defect site.

The effective threshold current simply estimated by the ratio of the defect area to the oxide aperture area is around 1.5 mA, assuming uniform current density within the oxide aperture. The threshold current density is >6kA/cm², which is higher than conventional oxide confined VCSELs. We attribute this to unintentional scattering loss introduced by the PhC structure, rather than reduced current injection efficiency. Lasing spectra of the device with d/$\Lambda$ of 0.5 confirmed single mode operation. A weak peak appearing at shorter wavelength than the lasing mode is reproducible in all of our devices operating in a photonic crystal confined mode, and is thought to be one of the oxide confined modes. Experimental devices also exhibited strong emissions in the defect site(s). The emissions corresponded to the shape of the defect. Thus, a hexagonal emission pattern was evidenced in an experimental device with a hexagonal missing defect defined by a triangular pattern of holes. Experimental devices utilized a structure with a large oxide aperture to prevent a significant contribution of the oxide aperture to the photonic crystal confined mode. A current confinement technique that does not introduce a large refractive index step, i.e., an ion-implanted structure, would enable current aperture size to fit photonic crystal confined modes. As a result, low threshold current and high efficiency, as well as high output power operation should be possible.

While specific embodiments of the present invention have been shown and described, it should be understood that other modifications, substitutions and alternatives are apparent to one of ordinary skill in the art. Such modifications, substitutions and alternatives can be made without departing from the spirit and scope of the invention, which should be determined from the appended claims.

Various features of the invention are set forth in the appended claims.

The invention claimed is:

1. A vertical cavity surface emitting laser including a vertical cavity, the laser comprising:
    a substrate;
    a bottom distributed Bragg reflector;
    a top distributed Bragg reflector;
    an electrical current aperture;
    top and bottom electrodes; and
    the vertical cavity between said bottom and said top distributed Bragg reflectors containing an active region; wherein said vertical cavity includes:
        a plurality of holes arranged in a plurality of patterns; and
        at least one missing hole defect in each of said patterns, a ratio of the hole diameter divided by the hole pitch being dependent upon the hole depth and set to produce single transverse mode operation; wherein some of said patterns are different and some are matched to provide transverse optical coupling.

2. The structure of claim 1, wherein patterns are matched by having matched dimensions of said holes, pitch between holes, hole depth and defect radius.

3. A vertical cavity surface emitting laser including a vertical cavity, the laser comprising:
   the substrate;
   a bottom distributed Bragg reflector;
   a top distributed Bragg reflector;
   an electrical current aperture;
   top and bottom electrodes; and
   a vertical cavity between said bottom and said top distributed Bragg reflectors containing an active region; wherein said vertical cavity includes:
      a plurality of holes arranged in a pattern; and
      at least one missing hole defect in the pattern, a ratio of the hole diameter divided by the hole pitch being dependent upon the hole depth and set to produce single transverse mode operation;
   wherein a radius of said missing hole defect is set to achieve single mode operation; and
   wherein dimensions are set such that the V-parameter of the laser is set such that $V_{eff}$ is less than ~2.405, wherein $V_{eff}$ is defined by:

$$V_{eff} = \frac{2\pi r}{\lambda}\sqrt{n_{eff}^2 - (n_{eff} - \gamma \Delta n)^2}$$

where $\lambda$ is an operating wavelength, r is an equivalent defect radius, $n_{eff}$ is the effective refractive index of the said vertical cavity without a photonic crystal hole pattern and defect structure present, $\Delta n$ is the refractive index reduction introduced by the said pattern and said one or more defects, and $\gamma$ is the depth dependence single transverse mode factor.

4. The laser of claim 3, wherein said plurality of holes and said defect are finite depth holes formed in said top distributed Bragg reflector.

5. The laser of claim 3, wherein said plurality of holes are finite depth holes that extend through said vertical cavity and extend through at least a part of each of said top and bottom distributed Bragg reflectors.

6. The laser of claim 3, wherein said plurality of holes are infinite depth holes.

7. The laser of claim 3, comprising a plurality of defects arranged in said pattern.

8. The structure of claim 7, wherein said pattern comprises a seven point defect pattern.

9. The structure of claim 8, further comprises additional seven point defect patterns.

10. The laser of claim 3, wherein said electrical current aperture comprises an oxidized region in said vertical cavity.

11. The laser of claim 3, wherein said electrical current aperture comprises an ion implanted region in said vertical cavity.

12. The laser of claim 3, wherein $\Delta n$ is set through optimization to an increased amount that maintains $V_{eff}$ is less than ~2.405.

13. The laser of claim 12, wherein $\Delta n$ is set to be greater than $10^{-3}$.

14. A photonic crystal defect structure in a vertical cavity surface emitting laser including a vertical cavity, the laser comprising:
   a substrate;
   a bottom electrode electrically contacting said substrate;
   a bottom distributed Bragg reflector formed on an opposite side of said substrate from said bottom electrode;
   a top distributed Bragg reflector;
   a plurality of finite depth holes arranged in a pattern and a missing hole defect in the pattern, the pattern being formed in at least a portion of said top distributed Bragg reflector, the diameter, pitch and depth of the holes being defined by a depth dependence single transverse mode factor;
   the vertical cavity including claddings that clad an active region, said vertical cavity being between said top and bottom distributed Bragg reflectors; and
   a top electrode including an aperture larger than the pattern;
   comprising a plurality of said patterns, wherein some of said patterns are different and some are matched to provide transverse optical coupling.

15. A photonic crystal defect structure in a vertical cavity surface emitting laser, comprising:
   a plurality of holes arranged in a pattern; and
   at least one missing hole defect in the pattern, a ratio of the hole diameter divided by the hole pitch being dependent upon the hole depth and set to produce single transverse mode operation;
   wherein a radius of said missing hole defect is set to achieve single mode operation; and
   wherein dimensions are set such that the V-parameter of the laser is set such that $V_{eff}$ is less than ~2.405, wherein V is defined by:

$$V_{eff} = \frac{2\pi r}{\lambda}\sqrt{n_{eff}^2 - (n_{eff} - \gamma \Delta n)^2}$$

where $\gamma$ is an operating wavelength, r is an equivalent defect radius, $n_{eff}$ is the effective refractive index of the said vertical cavity without a photonic crystal hole pattern and defect structure present, $\Delta n$ is the refractive index reduction introduced by the said pattern and said one or more defects, and $\gamma$ is the depth dependence single transverse mode factor.

* * * * *

UNITED STATES PATENT AND TRADEMARK OFFICE
CERTIFICATE OF CORRECTION

PATENT NO.        : 7,085,301 B2
APPLICATION NO. : 10/618034
DATED             : August 1, 2006
INVENTOR(S)      : Choquette et al.

It is certified that error appears in the above-identified patent and that said Letters Patent is hereby corrected as shown below:

Column 9, line 3, please delete "the substrate" and insert --a substrate-- therefor.

Column 9, line 8, please delete "a vertical cavity", and insert --the vertical cavity-- therefor.

Column 10, line 40, please delete "Vis", and insert --$V_{eff}$ is-- therefor.

Signed and Sealed this

Twentieth Day of November, 2007

JON W. DUDAS
*Director of the United States Patent and Trademark Office*